US012607812B2

(12) United States Patent
Zilkie et al.

(10) Patent No.: US 12,607,812 B2
(45) Date of Patent: Apr. 21, 2026

(54) SWITCH ASSEMBLY

(71) Applicant: Sicily Merger Sub II, Inc., Santa Clara, CA (US)

(72) Inventors: Aaron John Zilkie, Pasadena, CA (US); Guomin Yu, Glendora, CA (US); Brett Sawyer, Pasadena, CA (US)

(73) Assignee: Sicily Merger Sub II, Inc., Santa Clara, CA (US)

( * ) Notice: Subject to any disclaimer, the term of this patent is extended or adjusted under 35 U.S.C. 154(b) by 131 days.

(21) Appl. No.: 17/909,344

(22) PCT Filed: Mar. 5, 2021

(86) PCT No.: PCT/EP2021/055680
§ 371 (c)(1),
(2) Date: Sep. 2, 2022

(87) PCT Pub. No.: WO2021/176095
PCT Pub. Date: Sep. 10, 2021

(65) Prior Publication Data
US 2023/0089415 A1 Mar. 23, 2023

Related U.S. Application Data

(60) Provisional application No. 62/986,529, filed on Mar. 6, 2020.

(51) Int. Cl.
*G02B 6/42* (2006.01)
*H01L 25/16* (2023.01)

(52) U.S. Cl.
CPC ......... *G02B 6/4246* (2013.01); *G02B 6/4274* (2013.01); *H01L 25/167* (2013.01)

(58) Field of Classification Search
CPC .... G02B 6/4246; G02B 6/4274; G02B 6/428; G02B 6/43; G02B 6/12004; H01L 25/167;
(Continued)

(56) References Cited

U.S. PATENT DOCUMENTS 9,235,001 B2 1/2016 Sekiguichi
10,826,613 B1 * 11/2020 Liang ....................... B60G 3/00
(Continued)

FOREIGN PATENT DOCUMENTS

| JP | 2015204456 A | 11/2015 |
| JP | 2015216169 A | 12/2015 |
| JP | 2018010325 A | 1/2018 |

OTHER PUBLICATIONS

International Search Report and Written Opinion of the International Searching Authority, Mailed Jun. 7, 2021, Corresponding to PCT/EP2021/055680, 8 pages.
(Continued)

*Primary Examiner* — Thomas A Hollweg
*Assistant Examiner* — Kirsten D. Endresen
(74) *Attorney, Agent, or Firm* — John Maldjian, Esq.; Stevens & Lee PC

(57) ABSTRACT

An integrated switch assembly having a stacked configuration, the integrated switch assembly comprising: a first layer, the first layer comprising a photonic integrated circuit, PIC; a second layer, the second layer comprising a switch ASIC; wherein the first layer is mounted onto a substrate and the second layer is mounted on top of the first layer.

12 Claims, 17 Drawing Sheets

(58) Field of Classification Search

CPC . H01L 2224/16145; H01L 2224/16225; H01L 23/49838; H01L 23/49827; H04B 10/40; H04B 10/801; H04Q 11/0005

See application file for complete search history.

(56) References Cited

U.S. PATENT DOCUMENTS

| | | | | |
|---|---|---|---|---|
| 2001/0038100 | A1* | 11/2001 | Yap | G02B 6/4232 |
| | | | | 257/E27.129 |
| 2006/0177173 | A1* | 8/2006 | Shastri | G02F 1/025 |
| | | | | 257/E31.095 |
| 2010/0214651 | A1 | 8/2010 | Kim et al. | |
| 2012/0177381 | A1 | 7/2012 | Dobbelaere et al. | |
| 2015/0295098 | A1 | 10/2015 | Toda | |
| 2015/0323754 | A1* | 11/2015 | Leigh | G02B 6/3897 |
| | | | | 385/14 |
| 2016/0274316 | A1* | 9/2016 | Verdiell | G02B 6/428 |
| 2017/0047312 | A1* | 2/2017 | Budd | H01L 23/585 |
| 2017/0131469 | A1* | 5/2017 | Kobrinsky | G02B 6/4257 |
| 2018/0203187 | A1* | 7/2018 | Doerr | G02B 6/428 |
| 2019/0036618 | A1* | 1/2019 | Hasharoni | G02B 6/425 |
| 2019/0333905 | A1 | 10/2019 | Raghunathan et al. | |

OTHER PUBLICATIONS

Goergen, J., "Spanning SERDES Across Reaches—Finding the Best Modulation Approach", Cisco Systems / Vasu Parthasarathy—Broadcom Version r7, IEEE802.3bs 400GE, Nov. 2014, San Antonio, Texas, U.S., pp. 1-22, IEEE.

U.K. Intellectual Property Office Combined Search and Examination Report, dated Sep. 29, 2021, for Patent Application No. GB2103125.7, 7 pages.

U.K. Intellectual Property Office Examination Report, dated Feb. 8, 2023, for Patent Application No. GB2103125.7, 3 pages.

European Examination Report mailed Oct. 7, 2024, issued in connection with corresponding European Patent Application No. 21710923.0 (6 pages total).

Japanese Office Action mailed Mar. 4, 2025; issued in connection with corresponding Japanese Patent Application No. 2022-553114 with English translation (10 pages total).

Japanese Office Action mailed Mar. 4, 2025; issued in connection with corresponding Japanese Patent Application No. 2022-553114 with English translation (6 pages total).

* cited by examiner

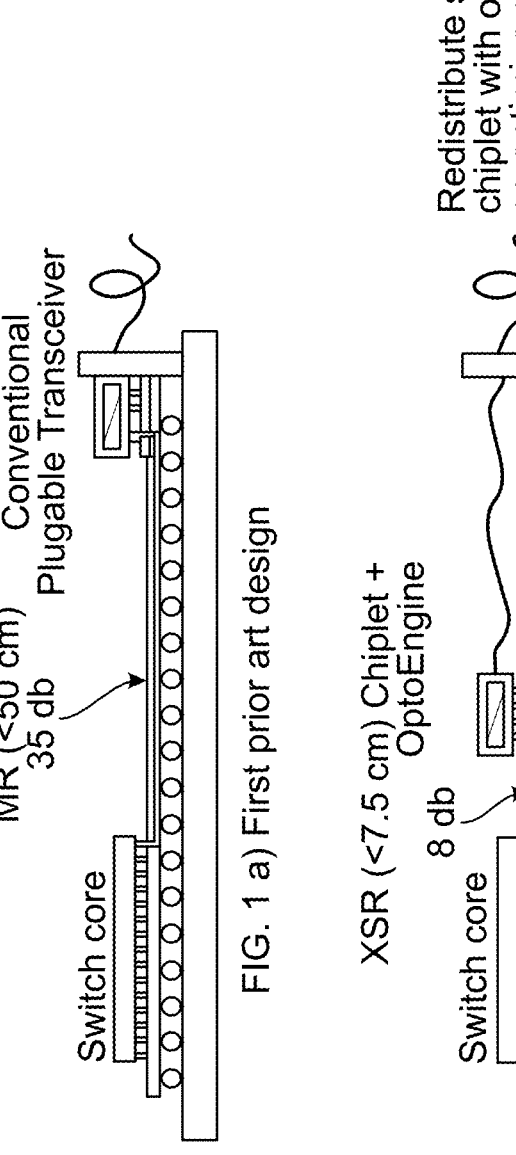

MR (<50 cm)     Conventional
35 db     Plugable Transceiver

Switch core

FIG. 1 a) First prior art design

XSR (<7.5 cm) Chiplet +
OptoEngine

Redistribute switch ASIC Integrate I/O
chiplet with optical engine
co-optimize switch and OE for power
250um/150um TX+RX pair 8 db Switch core FIG. 1 b) Second prior art design

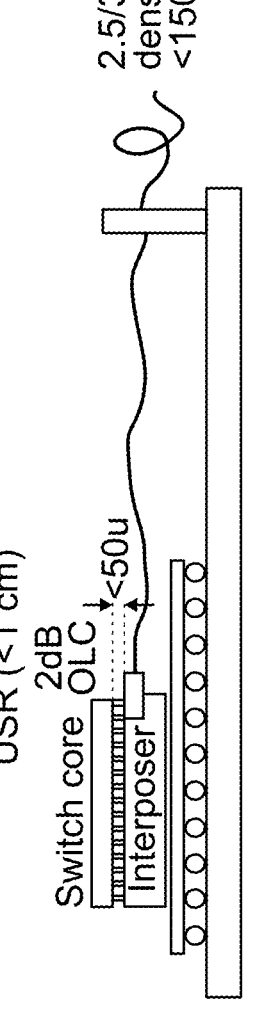

2.5/3D integration: Highest
density, lowest power
<150um TX+RX pair

USR (<1 cm)
2dB
OLC   <50u

Switch core
Interposer

FIG. 1 c) Integrated solution of present invention

FIG. 1

Digital ASIC 1

MD = modulator
TIA = trans-impedance amplifier

Digital ASIC 2

High speed
short-length
interconnects →

Mod Drivers

TIAs

Low speed TSVs
through PIC

NHA / SLI

Cu pillar or
solder bump

Mod Drivers

TIAs

Mod Drivers

Switch ASIC

DVR/TIA IC

MTP

TSV

TSV

TSV

TSV

TSV

TSV

TSV

TSV

C4

DVR/TIA IC

MTP

TSV

PIC

Next Higher Assembly (NHA)

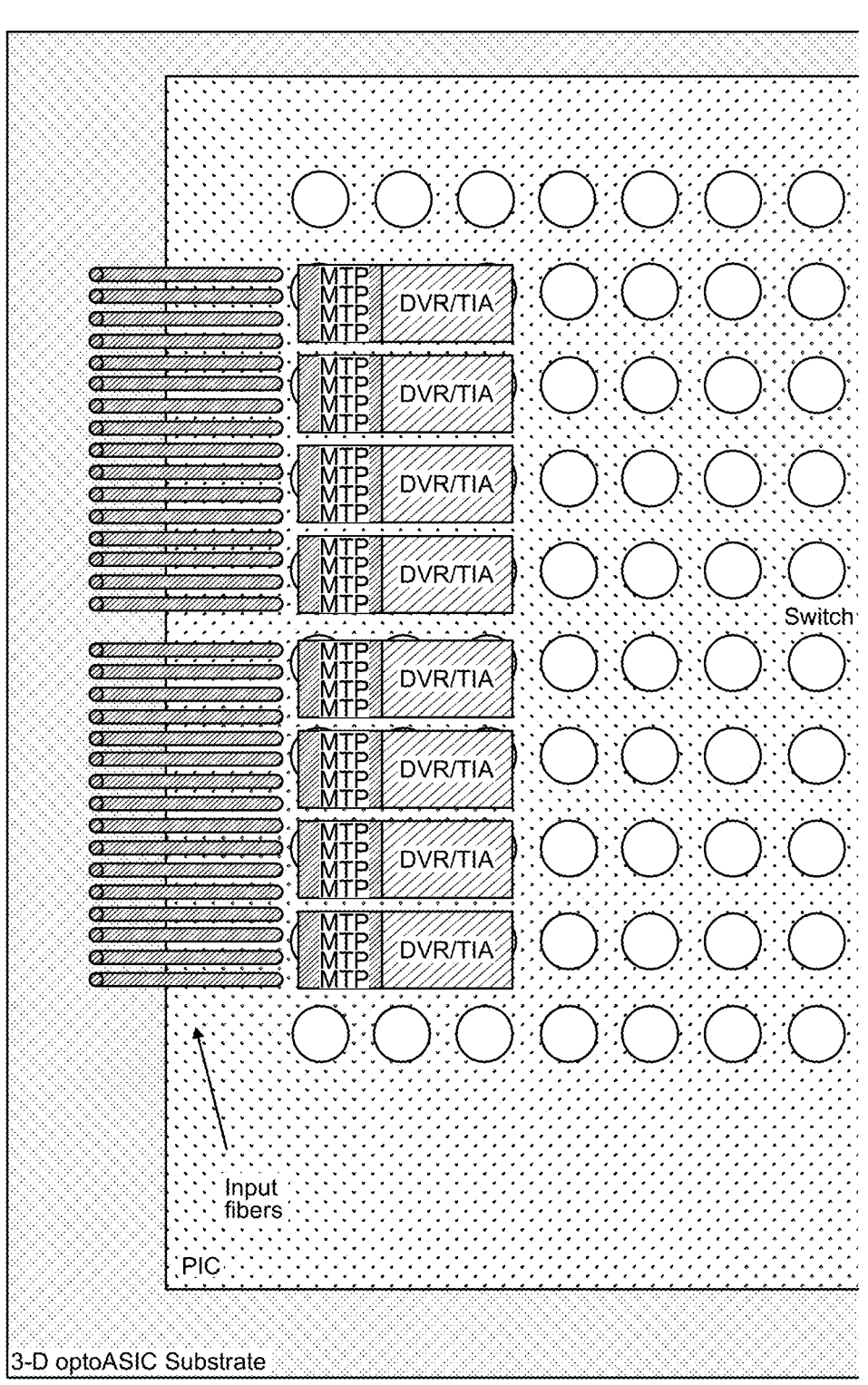
FIG. 14  (Continues overleaf – ⇥)    DVR ≈ Driver

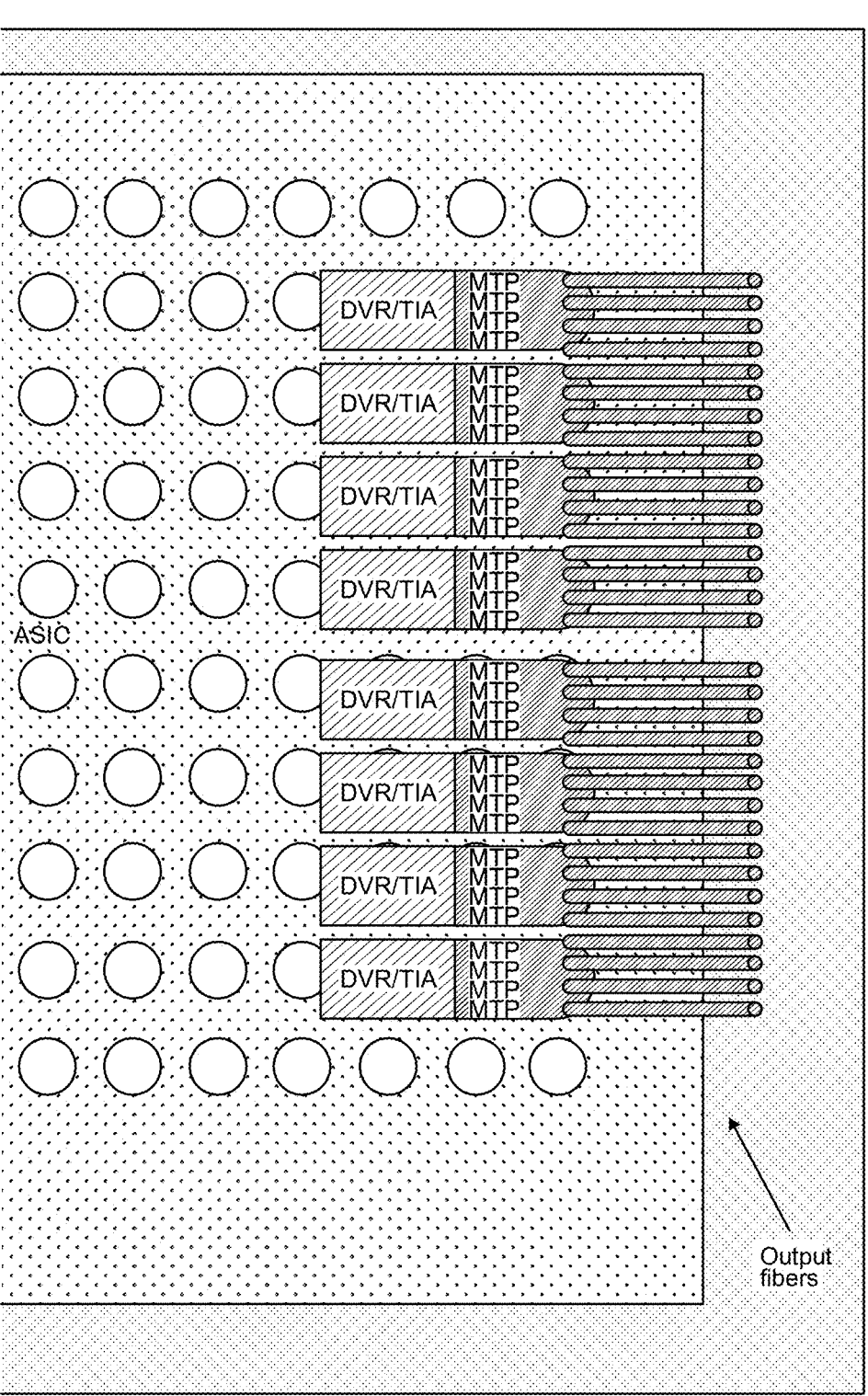
DVR = Driver          FIG. 14 (Continued)

SWITCH ASSEMBLY

CROSS-REFERENCE TO RELATED APPLICATIONS

This application is a U.S. National Phase Patent Application of International Application Number PCT/EP2021/055680, filed on Mar. 5, 2021, which claims priority to U.S. Provisional Patent Application No. 62/986,529, filed on Mar. 6, 2020, the entire content of each of which is incorporated herein by reference.

FIELD

One or more aspects of embodiments according to the present invention relate to a integrated switch assembly having a stacked configuration, and more particularly to a integrated switch assembly with a stacked configuration, the integrated switch assembly comprising a photonic integrated circuit, PIC and a switch ASIC mounted on top of the PIC.

BACKGROUND

Integrated photonic platforms are known and often provide the key to large scale production of photonic products. Typically, integrated or co-packaged concepts involve photonic inputs/outputs arranged around a perimeter of a digital ASIC. Photonic components such as modulators and photodiodes are typically also arranged around the perimeter of the ASIC and any drivers for these components located within the digital ASIC or integrated onto photonic integrated chips arranged around the perimeter of the ASIC. A problem with such arrangements is that often significant lengths of high speed traces (of the order of mm or cm) are required to connect components within the digital ASIC with the optical input/outputs. An aim of some embodiments of this invention is to reduce the need for large lengths of high speed traces in an integrated platform.

SUMMARY

Accordingly, some embodiments of the present invention aim to solve the above problems by providing an integrated switch assembly having a stacked configuration, the integrated switch assembly comprising:
- a first layer, the first layer comprising a photonic integrated circuit, PIC;
- a second layer, the second layer comprising a switch ASIC;
  - wherein the first layer is mounted onto a substrate and the second layer is mounted on top of the first layer.

The resulting stacked assembly is a 3D assembly. Typically the substrate may comprise one of the following: substrate, motherboard, organic substrate, next higher assembly. The material of the PIC may be a silicon-on-insulator material and it will be appreciated that ASIC is any relevant Application-Specific Integrated Circuit.

In mounting the second layer onto the first layer, the second layer is located directly on top of the first layer and certain components may be aligned exactly to minimize any electrical connection between the two components, the electrical connection being a vertical connection between the two layers. The components to be connected may therefore be aligned within the x and y directions and displaced relative to one another only along the z axis in that one component (e.g. a modulator driver) is located directly above the other component (e.g. a modulator).

Optional features of the invention will now be set out. These are applicable singly or in any combination with any aspect of the invention.

Optionally, the PIC comprises one or more vias, for providing an electrical contact between a component on the ASIC above the PIC and the substrate.

In some embodiments, the PIC is a silicon photonic PIC, for example a silicon on insulator material and the via is therefore a Through-Silicon Via (TSV). TSVs are low speed connections. In this way, the stacked configuration of some embodiments of the present invention has been designed to minimize high speed RF path length. This leads to a maximization of speed performance of the assembly as a whole and enables improved scalability.

Optionally, the PIC comprises a plurality of vias, each via providing an electrical contact between a component on the ASIC above the PIC and the substrate.

Optionally, the PIC of the first layer includes one or more modulators. Each modulator converting an unmodulated optical signal and a modulated electrical signal into a modulated optical signal.

The ASIC is typically a high density ASIC and may therefore involve compact optoelectric modulators such as MTP EAMs (Micro-Transfer Printed Electro-Absorption Modulator) or Ring Resonators (RR).

Optionally, the ASIC comprises one or more modulator drivers, each of the one or more modulator drivers configured to drive a respective one of the one or more modulators, each modulator converting an unmodulated optical signal and a modulated electrical signal into a modulated optical signal.

Optionally, the PIC of the first layer includes one or more photodiodes.

Optionally, the ASIC comprises one or more Transimpedance Amplifiers TIAs, each of the one or more TIAs configured to amplify a signal from a respective one of the one or more photodiodes.

Optionally, the PIC comprises an arrangement of modulators and photodiodes interspersed with one another.

Optionally, the ASIC comprises an arrangement of modulator drivers and TIAs interspersed with one another such that each modulator on the PIC is aligned with a modulator driver on the ASIC above it and each photodiode is aligned with a TIA on the ASIC above it. In such an arrangement, the interspersed arrangement of the modulator drivers and TIAs located on the typically mirrors the corresponding interspersed arrangement of the respective modulators and photodiodes in the PIC below it. In that way, the connection between each modulator and its corresponding modulator driver is minimized and each electrical connection between each photodiode and its corresponding TIA is also minimized.

Optionally, the PIC comprises at least one serialiser/deserialiser, SerDes.

Optionally, the PIC is itself arranged over two layers: a photonic component layer comprising modulators and/or photodiodes and a driver layer comprising modulator drivers and/or TIAs for the respective modulators and/or photodiodes.

Optionally, the driver layer is located in-between the photonic component layer and the substrate.

Optionally, the driver layer is located in-between the photonic component layer and the switch ASIC.

Optionally, the PIC includes one or more data in points at which optical fibres are connected to components on the PIC to bring optical signals into the PIC components.

Optionally, the one or more data in points include an optical demultiplexor.

Optionally, the PIC includes one or more data out points at which optical fibres are connected to components on the PIC to take out optical signals from PIC components.

Optionally, the one or more data out points include an optical multiplexor.

Optionally, the PIC further comprises one or more banks of lasers. Typically the bank of lasers will be a bank of hybrid lasers. Power splitters may be also be present to split laser inputs over multiple components.

Optionally, electrical connections between the PIC and the substrate include one or more of: Cu pillars, solder bump, controlled collapsed chip connection C4, a ball grid array BGA, and a column grid array CGA.

BRIEF DESCRIPTION OF THE DRAWINGS

These and other features and advantages of the present invention will be appreciated and understood with reference to the specification, claims, and appended drawings wherein:

FIG. 1 is a schematic diagram showing (a) a first related art design, (b) a second related art design, and (c) an integrated solution according to an embodiment of the present invention;

FIG. 2 shows two examples of ASIC layouts for the integrated switch assembly of some embodiments of the present invention.

FIG. 3 shows two examples of PIC layouts according to the integrated switch assembly of some embodiments of the present invention suitable for being mounted on top of the ASIC layer in a 3D stacked configuration.

FIG. 14 depicts a plan view of the embodiments disclosed in FIG. 11, FIG. 12, FIG. 13A, and FIG. 13B.

DETAILED DESCRIPTION

The detailed description set forth below in connection with the appended drawings is intended as a description of exemplary embodiments of an integrated switch assembly provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 2A:
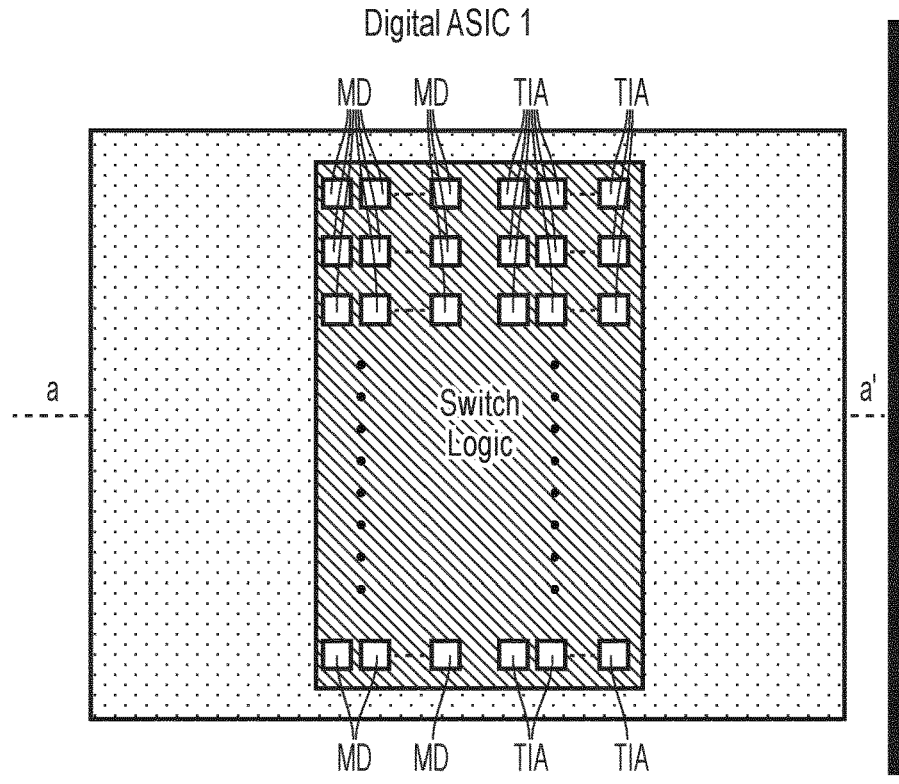
In FIG. 2A the ASIC layer includes a single switch logic including drivers for modulators and also TIAs for amplifying signals from photodiodes.
Figure 2B:
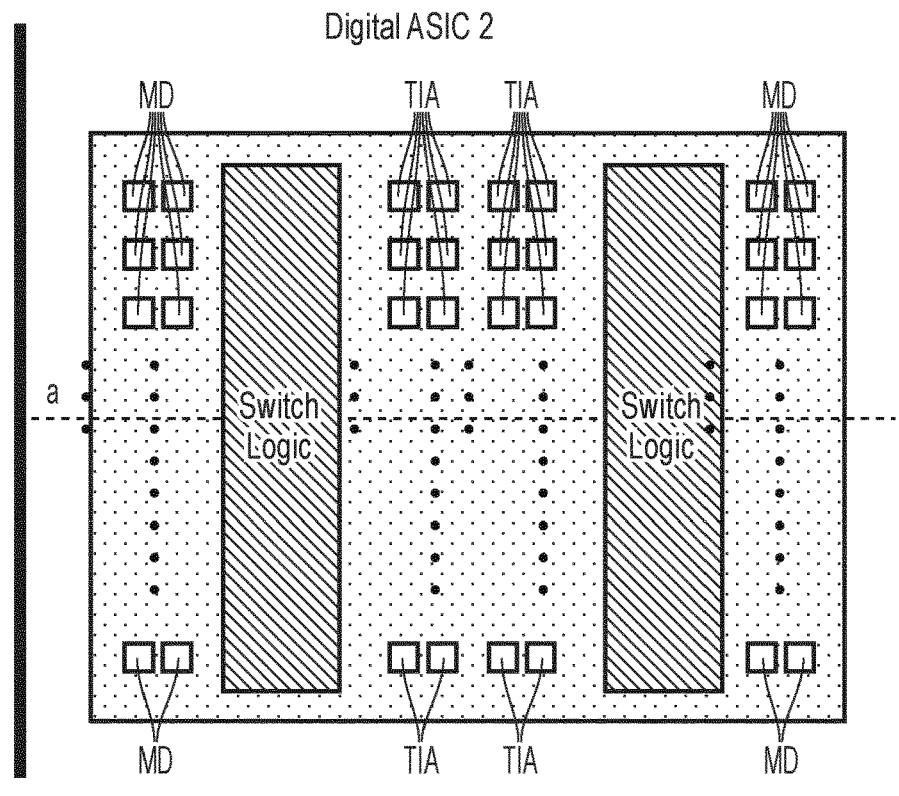
in FIG. 2B the ASIC layer is made up of two separate switch logic regions.

A first set of embodiments of an integrated switch assembly is described below, with reference to FIGS. 2-6. The integrated switch assembly has a stacked configuration so that components are arranged in 3D. The stacked arrangement includes a first layer, the PIC layer containing a Photonic Integrated Circuit (PIC) and a second layer, the ASIC layer comprising a switch ASIC. The switch ASIC includes switch logic, a plurality of drivers including a plurality of modulator drivers and a plurality of photo transimpedence amplifiers (TIAs). In the embodiment shown in FIG. 2A, these are located directly on the switch logic, an array of modulator drivers located at one side of the switch logic and an array of TIAs located at the other side of the switch logic. In the embodiment of FIG. 2B, the drivers are located adjacent to the switch logic, more specifically, there are two switch logic regions located on the ASIC layer with an array of TIAs located in-between the two switch logic regions and an array of modulator drivers located at the two opposing sides of the switch logic regions to the TIAs.

Figure 3A:
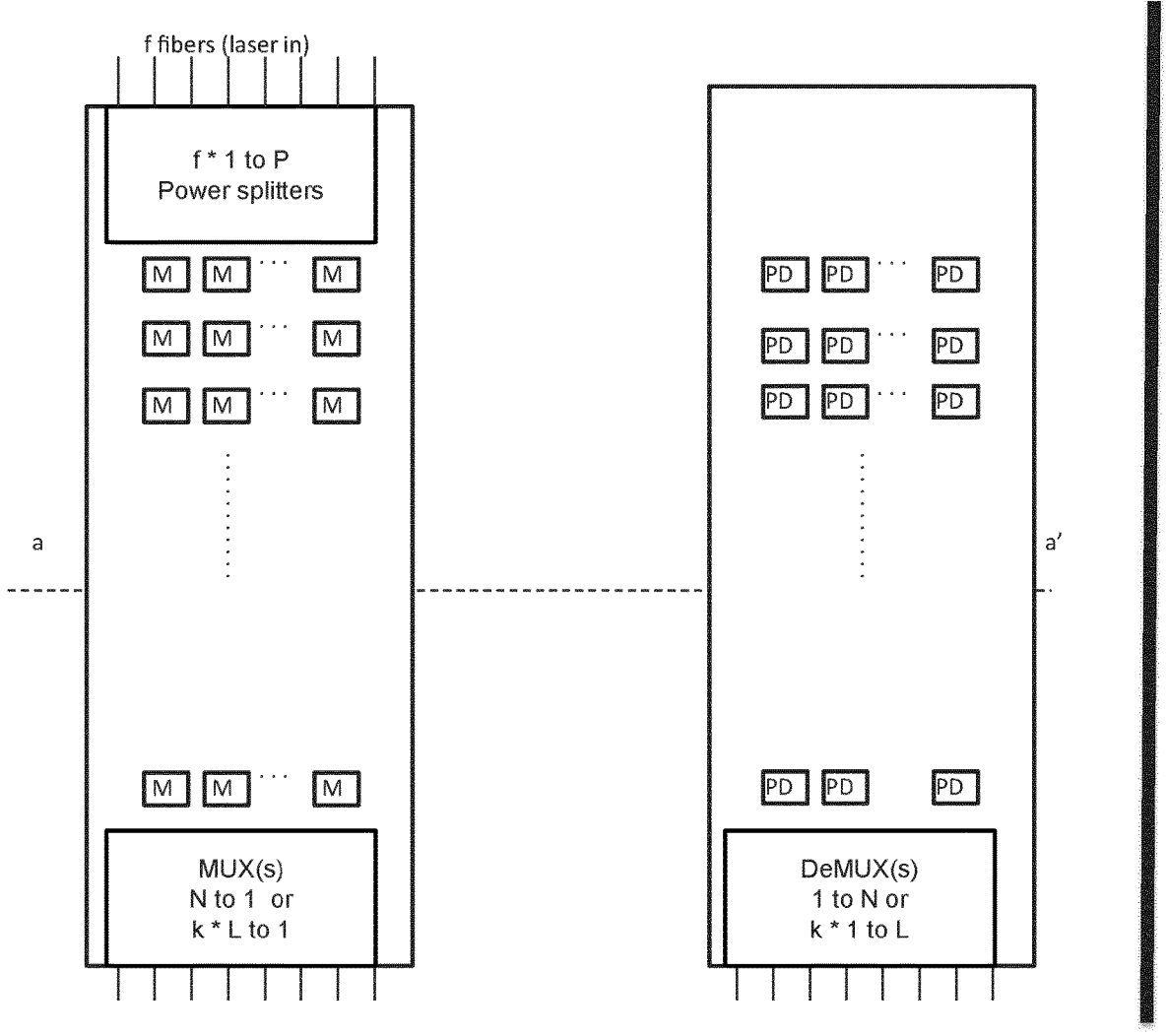
FIG. 3A discloses an example of a PIC layer that would be compatible with the ASIC layer of FIG. 2A.
Figure 3B:
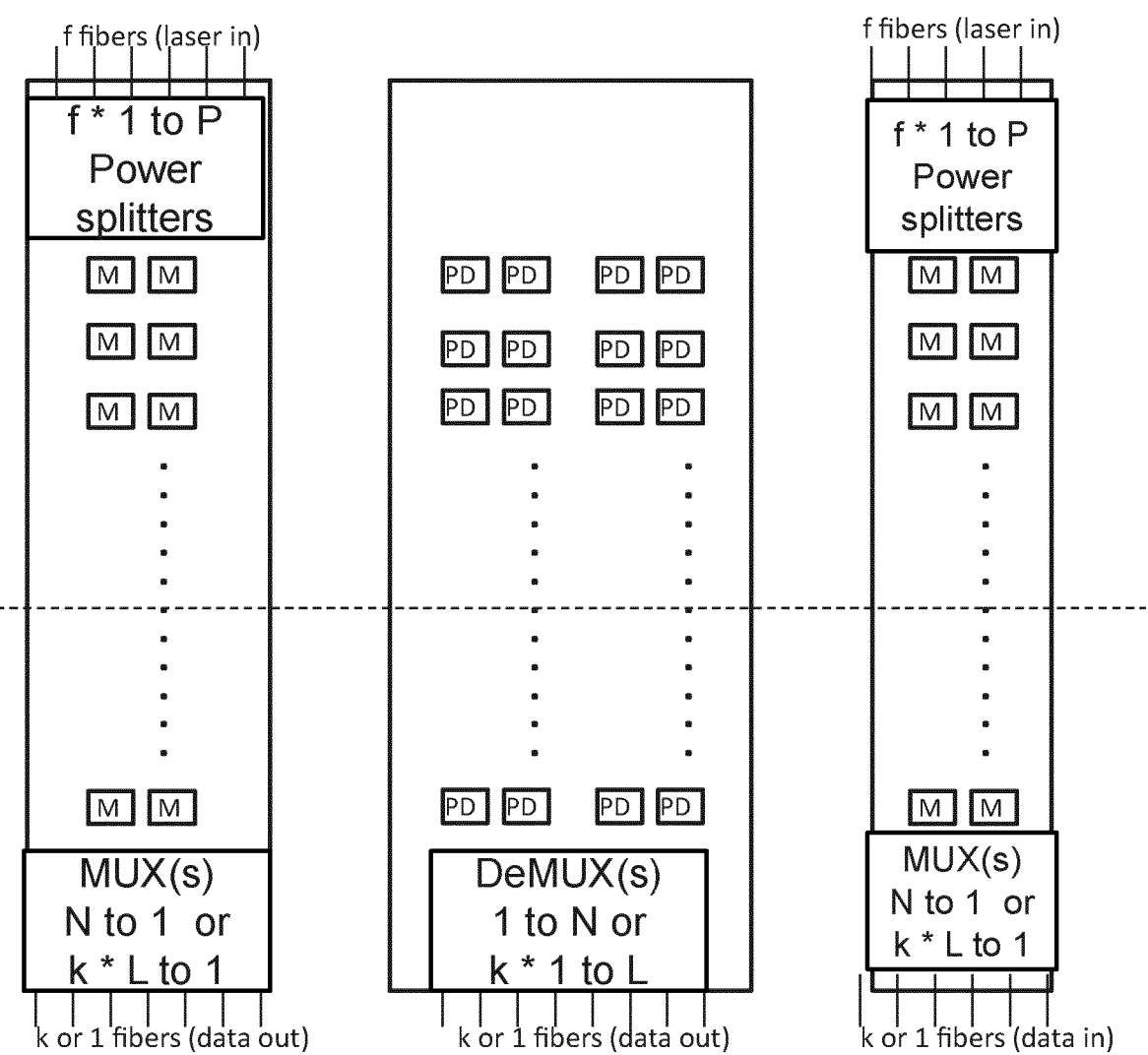
FIG. 3B discloses an example of a PIC layer that would be compatible with the ASIC layer of FIG. 2B.
Figure 4A:
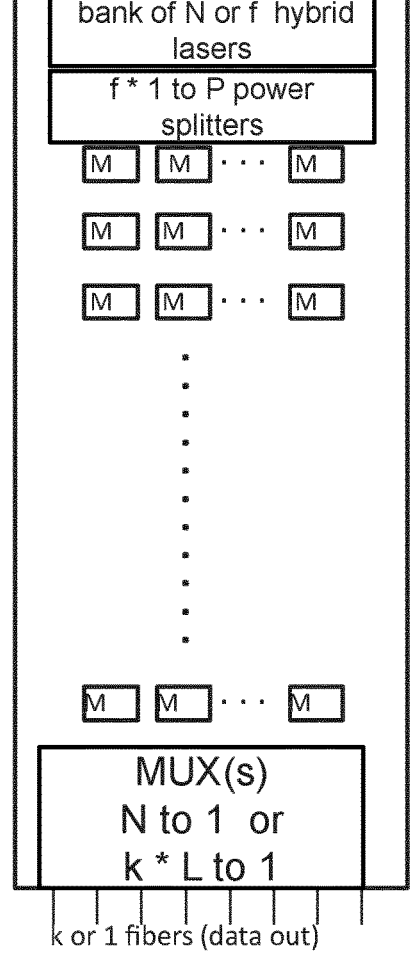
FIG. 4 shows two examples of PIC layouts containing on-chip hybrid lasers, FIG. 4A having a first configuration in which a bank of lasers is located at an end of the chip distal to the data output.
FIG. 4B having a bank of lasers located adjacent to the drivers and along a length of the PIC which extends transverse to the side at which the data outputs are located.
Figure 4B:
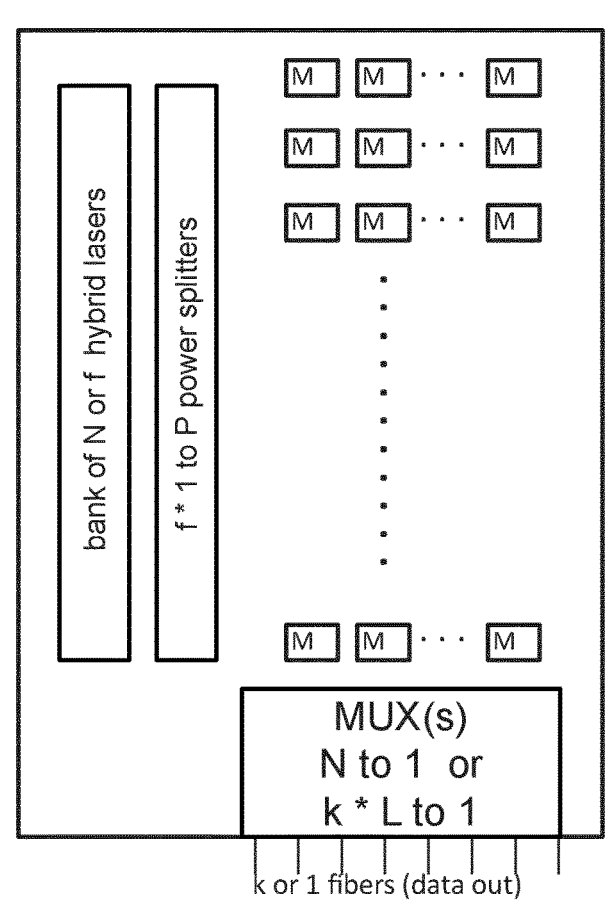
Figure 5A:
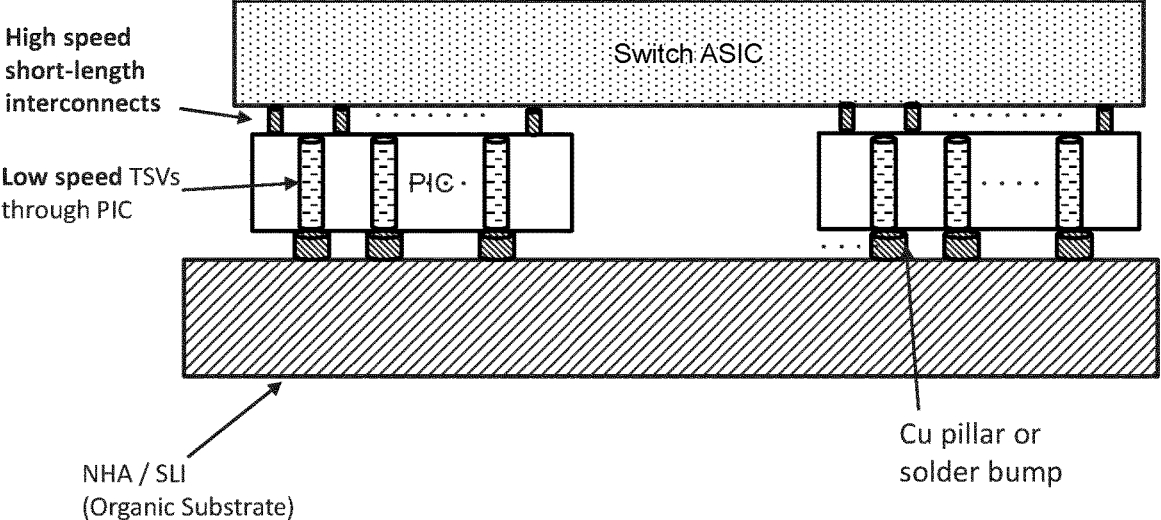
FIG. 5 depicts examples of a cross section of an integrated switch assembly according to some embodiments of the present invention with FIG. 5A showing an example compatible with the ASIC layer of FIG. 2A and the PIC layer of FIG. 3A and FIG. 5B showing an example compatible with the ASIC layer of FIG. 2B and the PIC layer of FIG. 3B.
Figure 5B:
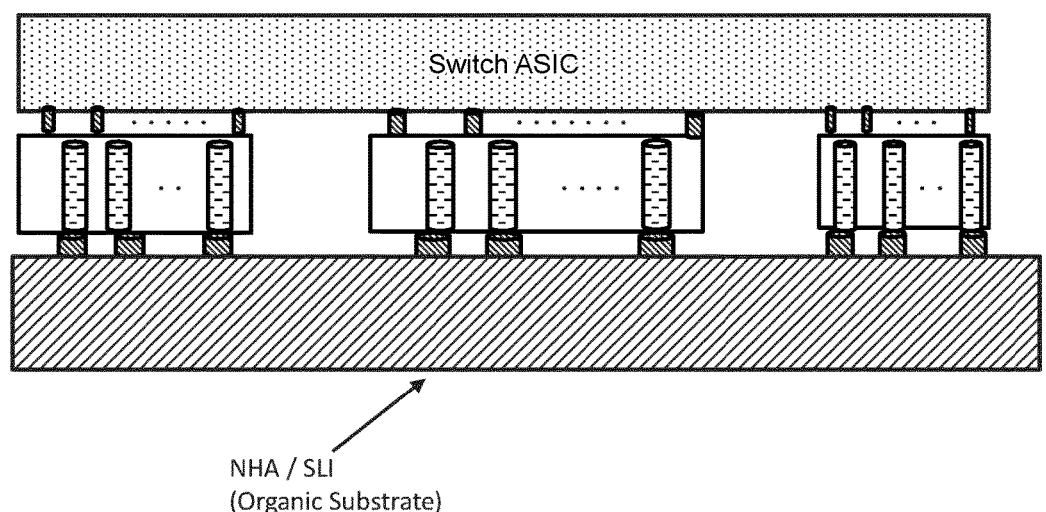
Figure 6A:
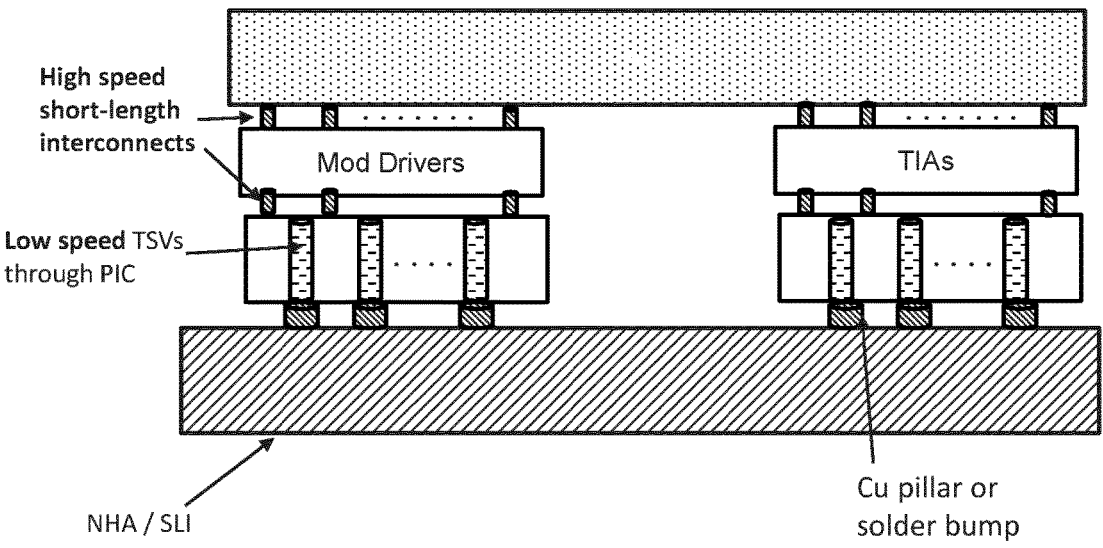
FIG. 6A showing an example compatible with the ASIC layer of FIG. 2A and the PIC layer of FIG. 3A and FIG. 6B showing an example compatible with the ASIC layer of FIG. 2B and the PIC layer of FIG. 3B.
Figure 6B:
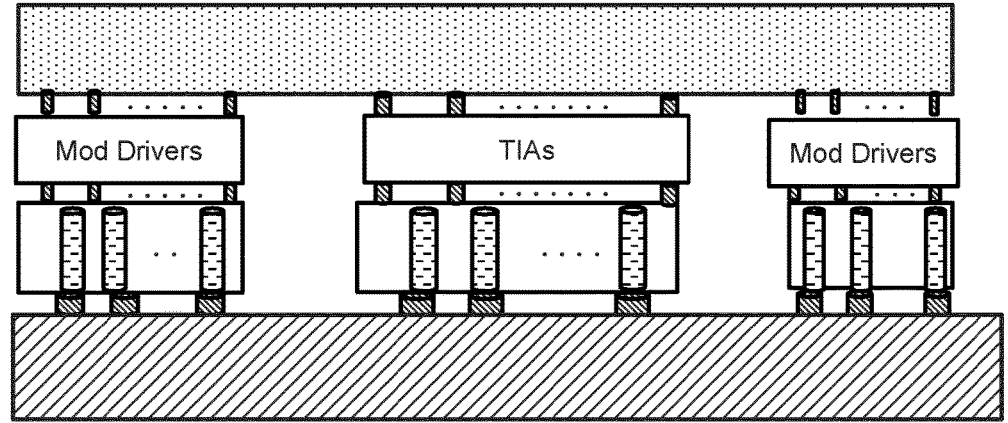
FIG. 6 depicts further examples of a cross section of an integrated switch assembly according to some embodiments of the present invention, this time exhibiting a PIC which is, itself, arranged over two layers, one sub layer of the two PIC layers including modulator drivers and TIAs.
Figure 7:
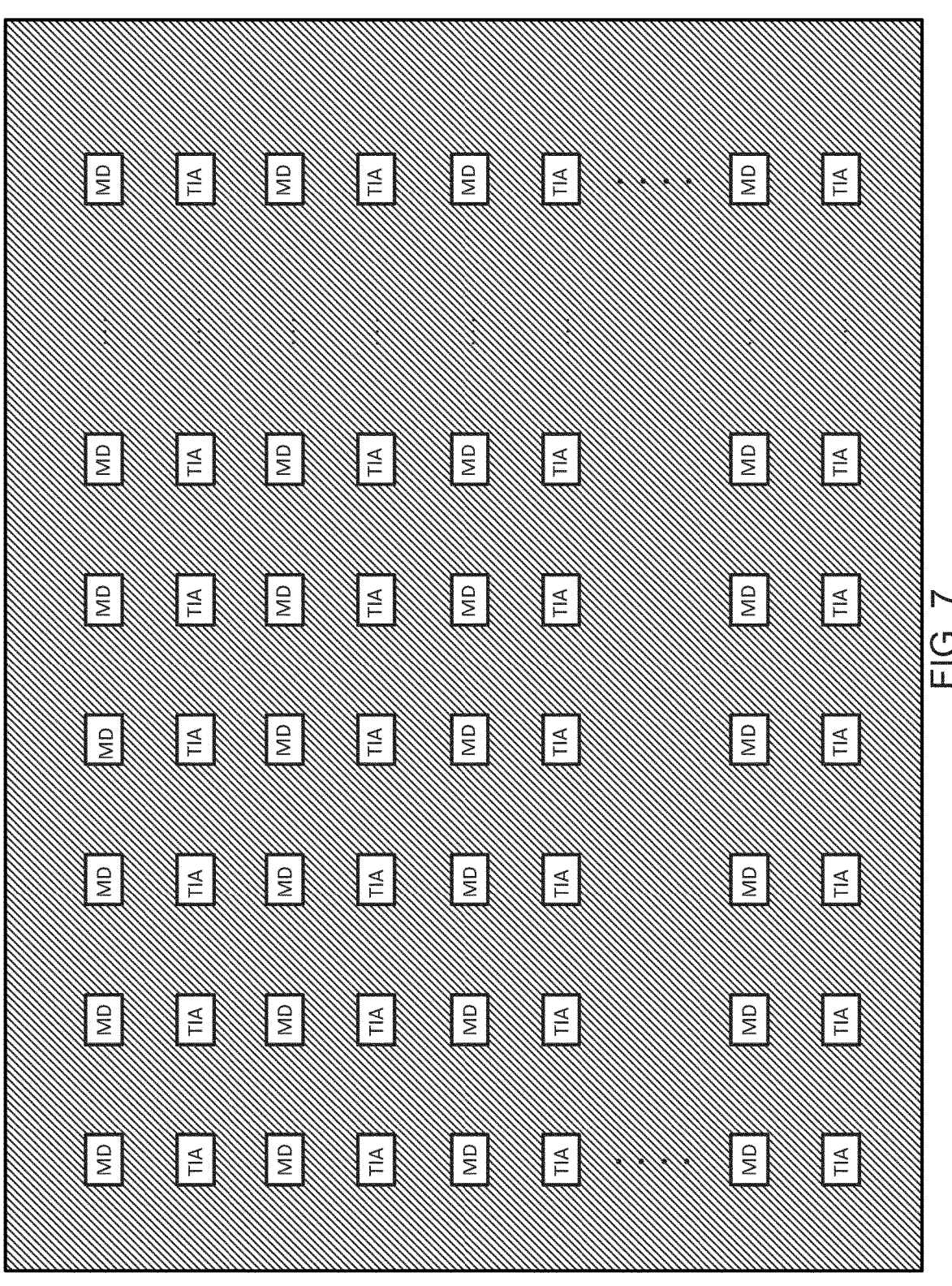
FIG. 7 depicts an example of an ASIC layer of an integrated switch assembly according to an embodiment of the present invention, the ASIC layer comprising an interspersed arrangement of modulator drivers and TIAs.
Figure 8:
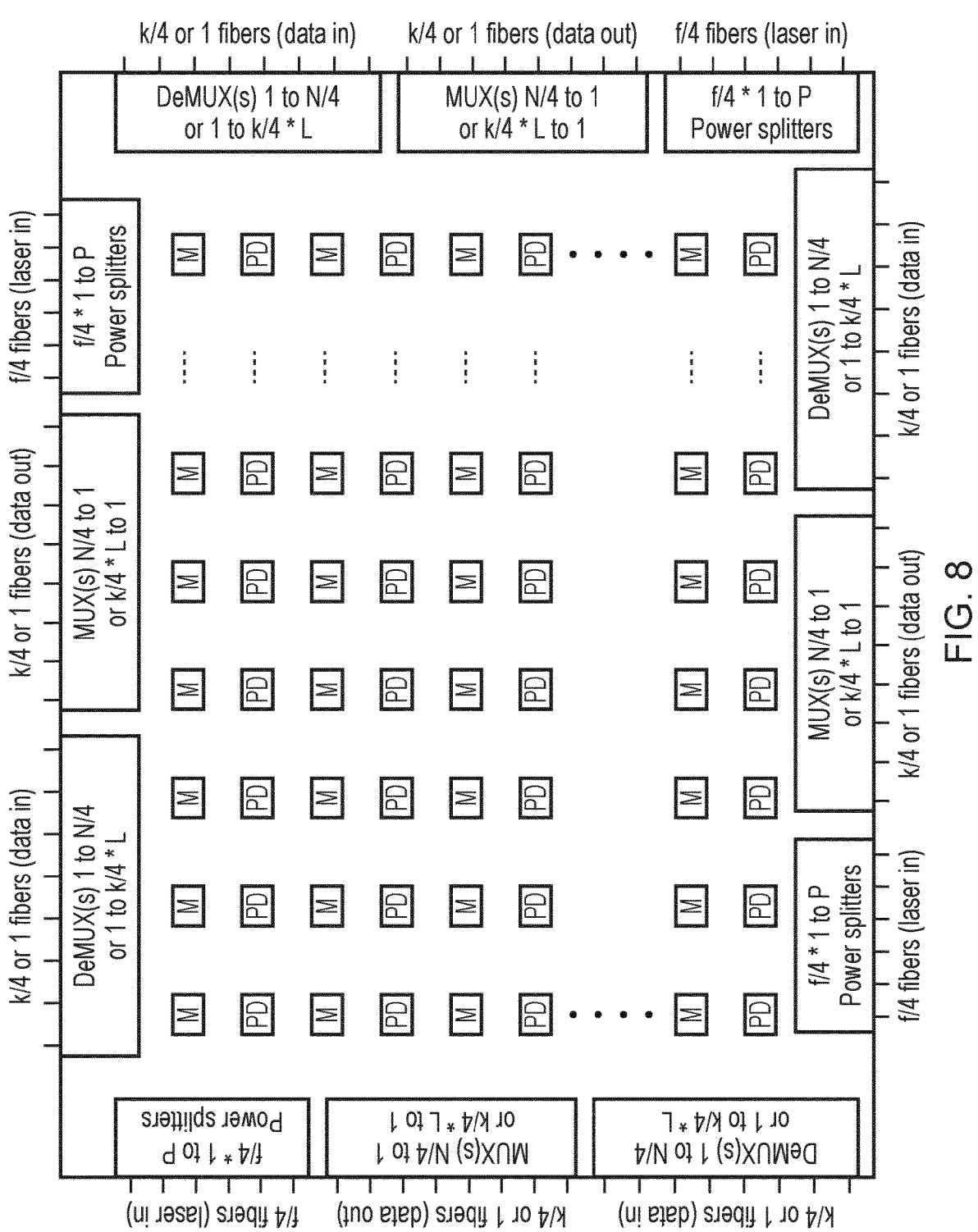
FIG. 8 depicts an example of a PIC layer of an integrated switch assembly according to an embodiment of the present invention, the PIC layer comprising an interspersed arrangement of modulators and photodiodes, the interspersed arrangement configured to match up with the arrangement of modulator drivers and TIAs of the ASIC shown in FIG. 7.
Figure 9:
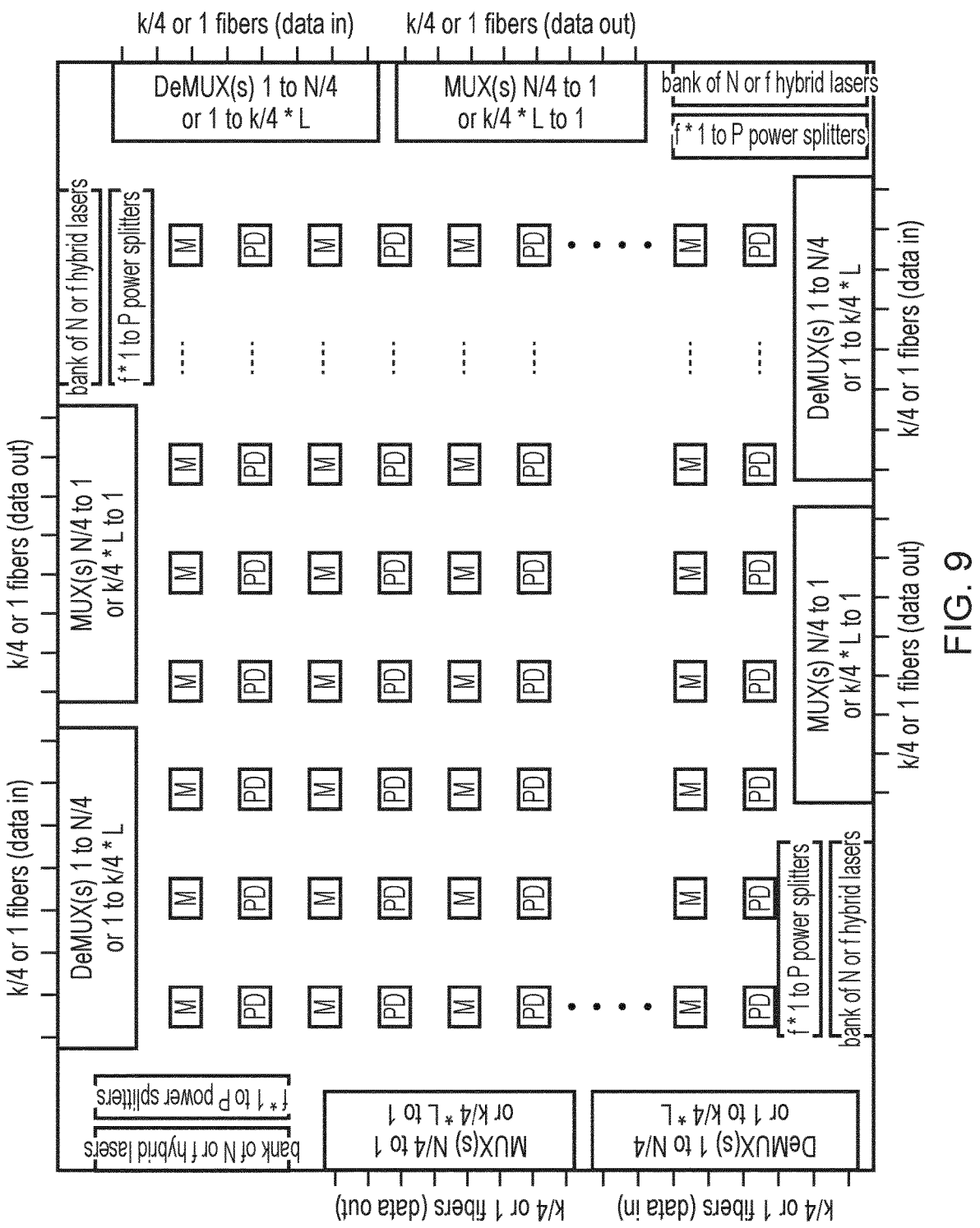
FIG. 9 depicts a further example of a PIC layer of an integrated switch assembly according to an embodiment of the present invention, the PIC layer comprising an interspersed arrangement of modulators and photodiodes along with integrated hybrid lasers, the interspersed arrangement configured to match up with the arrangement of modulators and TIAs of the ASIC shown in FIG. 7.
Figure 10:
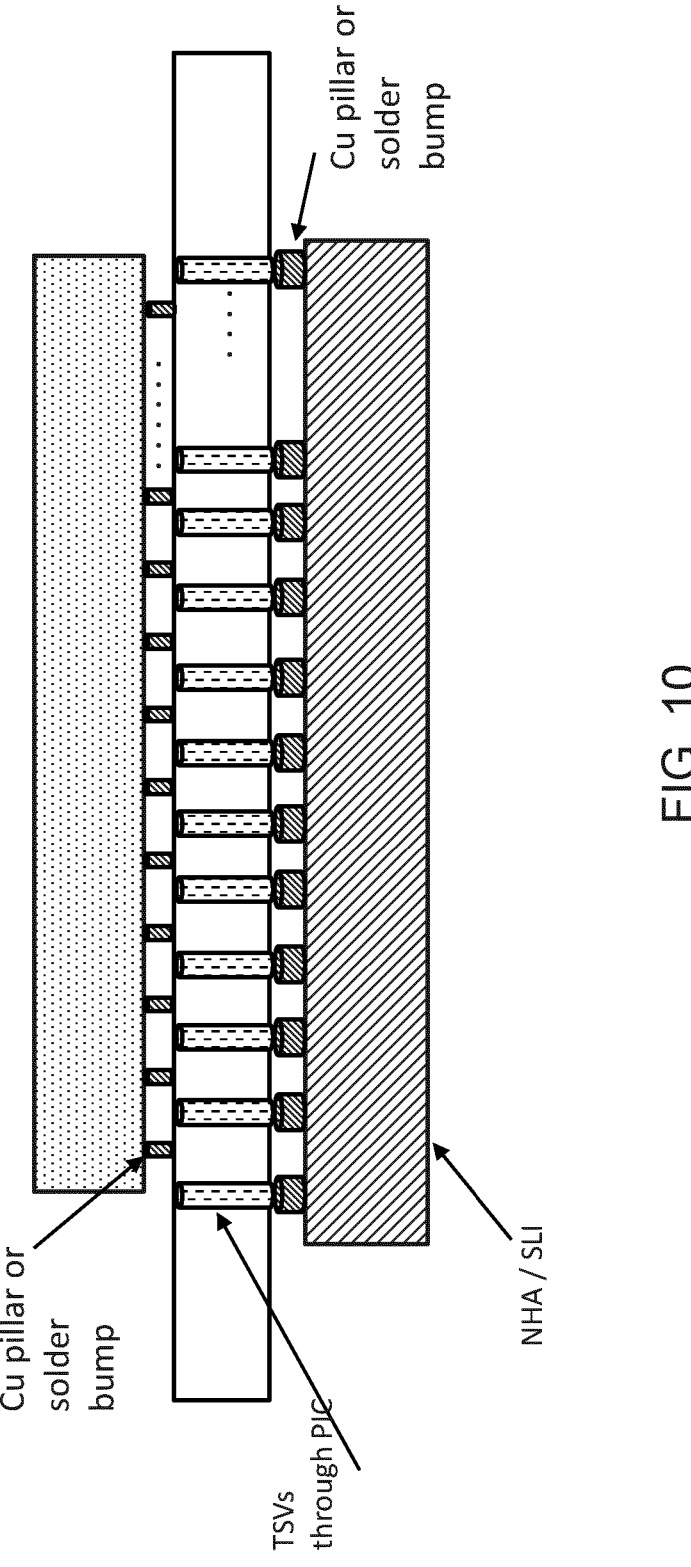
FIG. 10 depicts a cross section of an integrated switch assembly comprising the ASIC layer of FIG. 7 and the PIC layer of either FIG. 9 or FIG. 10.

As shown in FIGS. 3A and 3B, the PIC layer comprises modulators and photodiodes. The embodiment of FIG. 3A is configured to be mounted on top of the ASIC layer of FIG. 2A and is made up of a first portion comprising a laser input, an array of modulators and an optical multiplexor (MUX). The laser input takes the form of a plurality (e.g. a given integer f) of laser inputs, which may be fiber inputs. The PIC layer shown further comprises a plurality of power splitters (in this case f*1 to P power splitters (i.e., f power splitters, each being a 1 to P power splitter)) and an optical multiplexor (In this case N to 1 or k*L to 1 MUX). A second portion of the PIC layer includes an array of photodiodes and an optical demultiplexor (DeMUX) (in this case a 1 to N or k*1 to L DeMUX). The embodiment of FIG. 3B is configured to be mounted on top of the ASIC layer of FIG. 2B and therefore differs from that of FIG. 3A in that it includes two outer regions, each comprising an array of modulators, power splitters and multiplexor, and an inner region comprising an array of photodiodes and a DeMUX. The modulators and photodiodes of the PIC layer are arranged such that when the PIC layer is located directly on top of the ASIC layer, the modulators and photodiodes line up with their respective modulator drivers and TIAs that are located on the ASIC layer. FIGS. 4A and 4B show regions of the PIC containing modulators and differ from those shown in FIGS. 3A and 3B in that they further include a bank of lasers, typically hybrid lasers located directly on the PIC. As can be seen from the cross sections of FIGS. 5A and 5B, the PIC contains a plurality of low speed through silicon vias (TSVs) for providing an electrical connection between the substrate and the switch ASIC, through the PIC. In the embodiments of FIGS. 6A and 6B, the PIC is itself made up of two layers, a first sub layer containing the photonic components and a second sub layer containing the drivers for those components. In this embodiment, the ASIC layer therefore no longer needs to contain the drivers/TIAs in addition to the switch logic.

Cu pillars or solder bumps may form electrical connections between the PIC and any underlying substrate and also between the PIC layer and the ASIC layer.

A second set of embodiments is described below with reference to FIGS. 7-10. These embodiments relate to an integrated switch assembly having an ASIC layer (FIG. 7) with an interspersed arrangement of modulator drivers and TIAs and a corresponding PIC layer (FIG. 8) comprising an interspersed arrangement of modulators and photodiodes, the interspersed arrangement of the PIC being configured to match up with the arrangement of modulator drivers and TIAs of the ASIC shown in FIG. 7. As with previous embodiments, the PIC layer also comprises power splitters, MUXs and DeMUXs. However, in this embodiment, these are located around a perimeter, with the modulators and photodiodes located in the center of the PIC layer in an interspersed array. The interspersed array may take the form of alternate rows of modulators and rows of photodiodes. In some embodiments (FIG. 9), the PIC layer also includes one or more banks of lasers, which are typically located around the perimeter of the PIC. Generally, banks of lasers are located next to power splitters, the power splitters taking the optical input from the laser banks and into the optical components.

Further embodiments are described below with reference to FIGS. 11-13. In each case, an ASIC layer comprising a switch ASIC is located directly above a PIC layer and the PIC layer is located directly above a substrate (also known as a Next Higher Assembly). At least one driver layer comprising modulator drivers and/or TIAs is located in-between the PIC and the substrate. The driver layer is smaller than the PIC and is located directly underneath the region of the PIC at which the modulators and/or photodiodes are located. In the embodiment shown in FIG. 11, two driver layers are shown, each located at a respective side of the PIC adjacent the laser input fibers. This can be seen clearly in the plan view shown in FIG. 14, from which is can be seen that fiber inputs/outputs are located at two opposite sides of the PIC. TSVs are located throughout the PIC, including within the central region of the PIC. In the embodiment shown in FIG. 11 connections between the PIC and substrate comprise a column grid array (CGA).

Figure 11:
FIG. 11 depicts a cross section of a further embodiment of an integrated switch assembly, where connections between the PIC and substrate comprise a column grid array (CGA)
Figure 12:
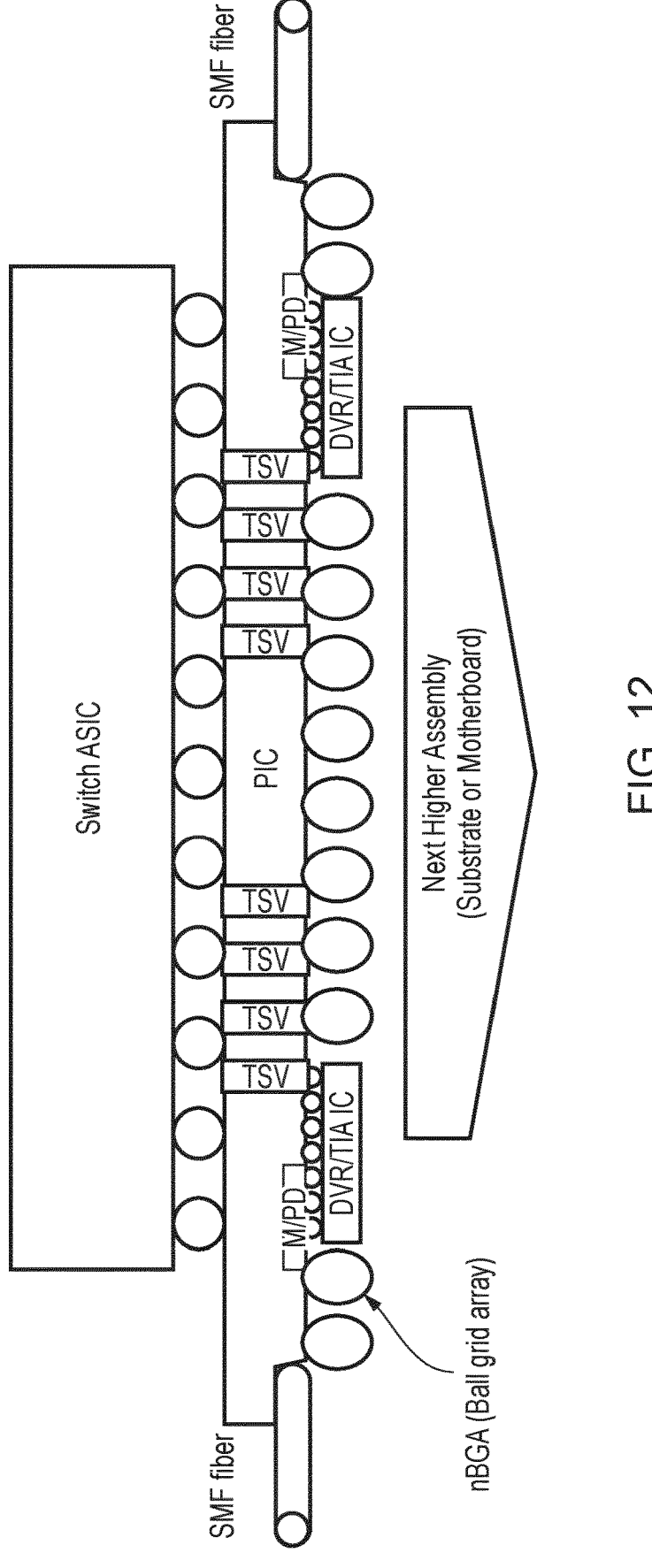
FIG. 12 depicts a cross section of a further embodiment of an integrated switch assembly, where connections between the PIC and substrate comprise a ball grid array (BGA)
Figure 13A:
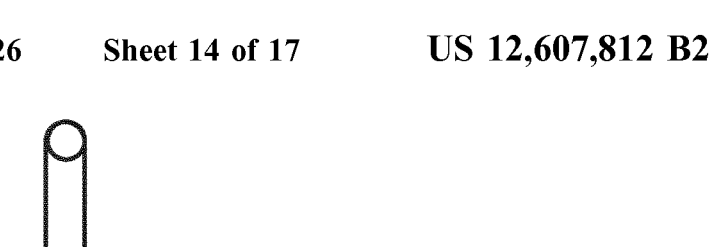
FIG. 13 depicts cross sections of two further embodiments of integrated switch arrays according to some embodiments of the present invention where connections between layers of the 3D switch assembly include a Controlled Collapsed Chip Connection (C4); in the embodiment of FIG. 13A a sub layer containing drivers is located between the PIC and the substrate; in the embodiment of FIG. 13B it is located in-between the PIC layer and the ASIC.
Figure 13B:

The embodiment of FIG. 12 differs from that of FIG. 11 in that connections between the PIC and substrate comprise a ball grid array (BGA). In the embodiments of FIGS. 13A and 13B connections between layers of the 3D switch assembly include a Controlled Collapsed Chip Connection (C4); in the embodiment of FIG. 13A a sub layer containing drivers is located between the PIC and the substrate whereas in the in the embodiment of FIG. 13B the driver sub layer is located in-between the PIC and the switch ASIC.

As used herein, "non-collapsible chip connections" means pins or non-collapsible bumps.

Although exemplary embodiments of an integrated switch assembly have been specifically described and illustrated herein, many modifications and variations will be apparent to those skilled in the art. Accordingly, it is to be understood that an integrated switch assembly constructed according to principles of this invention may be embodied other than as specifically described herein. The invention is also defined in the following claims, and equivalents thereof.

What is claimed is:

1. An application specific integrated circuit (ASIC) layer for use in a vertically-stacked multi-layer switch assembly comprising a substrate, a photonic integrated circuit (PIC) layer stacked on the substrate, and the ASIC layer stacked on the PIC layer, the ASIC layer comprising:

a two-dimensional array of modulator drivers comprising rows of modulator drivers and columns of modulator drivers; and a two-dimensional array of transimpedance amplifiers comprising rows of transimpedance amplifiers and columns of transimpedance amplifiers, wherein, the two-dimensional array of modulator drivers and the two-dimensional array of transimpedance amplifiers comprise an arrangement in the ASIC layer in which rows of modulator drivers alternate with rows of transimpedance amplifiers, or columns of modulator drivers alternate with columns of transimpedance amplifiers, wherein, the PIC layer comprises a two-dimensional array of modulators and a two-dimensional array of photodiodes, in which the two-dimensional array of modulators and the two-dimensional array of photodiodes comprise an arrangement in the PIC layer in which rows of modulators alternate with rows of photodiodes, or columns of modulators alternate with columns of photodiodes, wherein, the arrangement in the ASIC layer, comprising the two-dimensional array of modulator drivers and the two-dimensional array of transimpedance amplifiers, mirrors the arrangement in the PIC layer, comprising the two-dimensional array of modulators and the two-dimensional array of photodiodes, such that each modulator driver in the ASIC layer corresponds to a modulator in the mirrored PIC layer and each transimpedance amplifier in the ASIC layer corresponds to a photodiode in the mirrored PIC layer, and wherein, upon the ASIC layer and the PIC layer being stacked in the vertically-stacked multi-layer switch assembly, the arrangement in the ASIC layer, comprising the two-dimensional array of modulator drivers and the two-dimensional array of transimpedance amplifiers, is aligned with the arrangement in the PIC layer comprising, the two-dimensional array of modulators and the two-dimensional array of photodiodes, such that each modulator driver in the ASIC layer is electrically connected with, and configured to drive, its corresponding modulator in the mirrored arrangement in the PIC layer, and each transimpedance amplifier is electrically connected with, and configured to amplify a signal from, its corresponding photodiode in the mirrored arrangement in the PIC layer.

2. The ASIC layer of claim 1, wherein the ASIC layer and the PIC layer are aligned to minimize a length of an electrical connection between each modulator driver in the ASIC layer and the corresponding modulator in the PIC layer, and to minimize a length of an electrical connection between each transimpedance amplifier in the ASIC layer and the corresponding photodiode in the PIC layer.

3. The ASIC layer of claim 1, wherein the electrical connection between each modulator driver of the ASIC layer and the corresponding modulator of the PIC layer comprises a copper pillar or a solder bump.

4. The ASIC layer of claim 1, wherein the electrical connection between each transimpedance amplifier of the ASIC layer and the corresponding photodiode of the PIC layer comprises a copper pillar or a solder bump.

5. The ASIC layer of claim 1, wherein the PIC layer further comprises one or more data input points at which optical fibres are connected to bring optical signals into components in the PIC layer.

6. The ASIC layer of claim 5, wherein the one or more data input points include an optical demultiplexer.

7. The ASIC layer of claim 1, wherein the PIC layer further comprises one or more data output points at which optical fibres are connected to take out optical signals from components in the PIC layer.

8. The ASIC layer of claim 7, wherein the one or more data output points include an optical multiplexer.

9. The ASIC layer of claim 1, wherein the PIC layer further comprises one or more banks of lasers.

10. The ASIC layer of claim 9, wherein the one or more banks of lasers comprise hybrid lasers disposed around a perimeter of the PIC layer.

11. The ASIC layer of claim 1, wherein the PIC layer further comprises power splitters, multiplexers, and demultiplexers disposed around a perimeter of the PIC layer, and wherein the two-dimensional arrays of modulators and photodiodes are disposed in a central region of the PIC layer.

12. The ASIC layer of claim 1, wherein the PIC layer further comprises at least one serializer/deserializer (SerDes).

* * * * *